(12) United States Patent
Grimbergen et al.

(10) Patent No.: US 7,632,419 B1
(45) Date of Patent: Dec. 15, 2009

(54) APPARATUS AND METHOD FOR MONITORING PROCESSING OF A SUBSTRATE

(75) Inventors: Michael Grimbergen, Redwood City, CA (US); Shaoher X. Pan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1321 days.

(21) Appl. No.: 09/595,778

(22) Filed: Jun. 16, 2000

Related U.S. Application Data

(62) Division of application No. 08/944,240, filed on Oct. 6, 1997, now Pat. No. 6,129,807.

(51) Int. Cl.
G01J 3/00 (2006.01)
H01L 21/00 (2006.01)

(52) U.S. Cl. ............... 216/60; 216/67; 216/68; 216/71; 156/345.24; 156/345.48

(58) Field of Classification Search ............ 216/60, 216/63, 68, 71; 156/345, 345.24, 345.48; 118/712, 723 I; 438/16; 427/10; 702/24
See application file for complete search history.

(56) References Cited

U.S. PATENT DOCUMENTS

| | | | | |
|---|---|---|---|---|
| 4,198,261 A | 4/1980 | Busta et al. | ........... | 156/626 |
| 4,208,240 A | 6/1980 | Latos | ........... | 156/627 |
| 4,493,745 A | 1/1985 | Chen et al. | ........... | 156/626 |
| 4,842,683 A | 6/1989 | Cheng et al. | ........... | 156/345 |
| 4,859,277 A | 8/1989 | Barna et al. | ........... | 156/626 |
| 4,953,982 A | 9/1990 | Ebbing et al. | ........... | 356/357 |

(Continued)

FOREIGN PATENT DOCUMENTS

EP 459177 A2 * 12/1991

(Continued)

OTHER PUBLICATIONS

Barna et al., In Situ Metrology, pp. 35-44 of Chapter 22 of Handbook of Silicon Semiconductor Metrology, Edited by Alain Diebold, 2001(Marcel Dekker Inc).*

(Continued)

*Primary Examiner*—Allan Olsen
(74) *Attorney, Agent, or Firm*—Janah & Associates P.C.

(57) ABSTRACT

Apparatus for in-situ monitoring of a process in a semiconductor wafer processing system consists of a process chamber having a dome, an enclosure disposed above the chamber, a process monitoring assembly positioned proximate the dome, an opening in the dome, and a window covering the opening. A portion of the apparatus supports the process monitoring assembly to establish a line-of-sight propagation path of monitoring beams from above the dome, through the window to the substrate to facilitate etch depth measurement without encountering interference from high power energy sources proximate the chamber. A method of fabricating a process monitoring apparatus consists of the steps of boring an opening into a dome, positioning the process monitoring assembly in proximity to the dome so as to allow a line-of-sight propagation path of monitoring beams from the process monitoring assembly to a wafer, and covering the opening with a window. The window is permanent or removable dependent upon the type of process monitoring assembly being used in the system.

25 Claims, 6 Drawing Sheets

U.S. PATENT DOCUMENTS

| | | | |
|---|---|---|---|
| 4,975,141 A | 12/1990 | Greco et al. | 156/626 |
| 5,002,631 A | 3/1991 | Giapis et al. | 156/643 |
| 5,200,023 A | 4/1993 | Gifford et al. | 156/626 |
| 5,362,356 A | 11/1994 | Schoenborn | 156/626 |
| 5,372,673 A | 12/1994 | Stager et al. | 438/8 |
| 5,392,124 A | 2/1995 | Barbee et al. | 356/381 |
| 5,399,229 A | 3/1995 | Stefani et al. | 156/626 |
| 5,403,433 A | 4/1995 | Morrison et al. | 216/60 |
| 5,406,080 A | 4/1995 | Friedhelm | 250/309 |
| 5,445,705 A | 8/1995 | Barbee et al. | 156/627.1 |
| 5,450,205 A | 9/1995 | Sawin et al. | 356/382 |
| 5,451,289 A | 9/1995 | Barbee et al. | 216/59 |
| 5,456,788 A | 10/1995 | Barbee et al. | 156/345 |
| 5,467,883 A | 11/1995 | Frye et al. | 216/60 |
| 5,472,508 A | 12/1995 | Saxena | 118/723 EE |
| 5,536,359 A | 7/1996 | Kawada et al. | 438/16 |
| 5,571,366 A * | 11/1996 | Ishii et al. | 156/345.26 |
| 5,654,903 A | 8/1997 | Reitman et al. | 364/551.01 |
| 5,691,540 A | 11/1997 | Halle et al. | 250/372 |
| 5,716,451 A | 2/1998 | Hama et al. | 118/723 |
| 5,747,380 A | 5/1998 | Yu et al. | 438/599 |
| 5,770,097 A | 6/1998 | O'Neill et al. | 216/60 |
| 5,792,272 A | 8/1998 | Van Os et al. | 118/723 R |
| 5,807,761 A | 9/1998 | Coronel et al. | 438/14 |
| 5,824,158 A * | 10/1998 | Takeuchi et al. | 118/723 IR |
| 5,834,375 A | 11/1998 | Chen | 438/692 |
| 5,846,883 A | 12/1998 | Moslehi | 438/711 |
| 5,961,850 A * | 10/1999 | Satou et al. | 216/67 |
| 5,985,092 A * | 11/1999 | Chiu et al. | 156/345.25 |

FOREIGN PATENT DOCUMENTS

| | | |
|---|---|---|
| EP | 0735565 | 2/1996 |
| EP | 0756318 | 1/1997 |
| EP | 0788138 | 8/1997 |
| JP | 58033836 A * | 2/1983 |
| JP | 62-203335 A1 | 9/1987 |
| JP | 02288228 A * | 11/1990 |
| JP | 05299387 A * | 11/1993 |
| JP | 07-073997 A1 | 3/1995 |
| JP | 07086179 A * | 3/1995 |
| JP | 08-24082 A1 | 10/1996 |
| JP | 09-171995 A1 | 3/1997 |
| JP | 09-167762 A1 | 6/1997 |

OTHER PUBLICATIONS

International Search Report, dated Feb. 17, 1999.

Principles of Instrumental Analysis, $2^{nd}$ Ed., Skoog and West (Saunders, 1980) pp. 181, 182, 193, 245.

Sofie Instruments- Product User's Manual, Digitwin.

"In-Situ Control and Diagnosis of Deposition and Etch Processes is Possible Using Interferometry Combined with CCD Imaging", European Semi-Conductor, Mar. 1995, pp. 14-17.

F. Heinrich; P. Kopperschmidt, "Online Uniformity Measurements in Large Area Plasma Assisted Etching and Deposition", Proceedings of the $10^{th}$ International Colloquim on Plasma Process CIP '95, Antibes, France, Jun. 11-15, 1995.

* cited by examiner

APPARATUS AND METHOD FOR MONITORING PROCESSING OF A SUBSTRATE

CROSS-REFERENCE

This application is a divisional of U.S. patent application Ser. No. 08/944,240, filed on Oct. 6, 1997 now U.S. Pat. No. 6,129,807, which is incorporated herein by reference in its entirety.

BACKGROUND OF THE DISCLOSURE

1. Field of the Invention

The invention relates to semiconductor wafer processing systems.

2. Description of the Background Art

Semiconductor processing systems that perform "dry" etching of semiconductor wafers via plasmic gases, also known as reactive ion etching (RIE) require constant monitoring. While it is possible to predefine the etch parameters and allow the systems to perform the etch process unmonitored, conditions within the systems can change over time. Minute changes in the composition or pressure of an etch gas or process chamber or wafer temperature creates undesirable etch results.

For example, DRAM memory circuits are fabricated from semiconductor wafers using deep trench technology. A single DRAM memory cell consists of a capacitive storage cell and a switching element (i.e., a MOSFET transistor). Information (in the form of electrical charge) stored in the cell is passed on to other circuitry when the switching element is activated. Essentially very deep (on the order of 3-20 mm) channels or trenches must be formed in a semiconducting substrate in order to create the capacitive storage cells. Otherwise, the information is not sustained (i.e., the electrical charge "leaks out" of the storage cell).

Such trench etch circuits are formed by etching away different layers of insulating material deposited upon the substrate and the substrate itself in various steps. For example, first a photoresist mask is placed over an insulating layer or film (silicon dioxide or other similar material). The mask contains a desired circuit pattern to be etched into the insulating layer. It is important that etching of the insulating layer stop at the point where the substrate (silicon or other similar composition) is first revealed at the bottom of the trench. In a next step, the remaining portion of the photoresist mask is removed via an ashing operation so as to not remove any of the remaining insulating film or improperly etch the substrate. In a next step, a more involved chemical process etches a trench into the substrate material while continuously redepositing the insulating layer material so as to not attack the original insulating layer defining the circuit pattern. It can easily be seen that if the etch process during any one step exceeds the predetermined endpoint, the substrate, insulating layer and/or resultant circuit pattern may be damaged. As such, these systems rely upon some type of in situ measurement to determine the progressive depth of the etch process. In situ measurement provides greater control of the etch process and improves uniformity over a batch of processed wafers.

There has been some success in the art of developing in situ etch depth measuring systems that utilize optical emission spectroscopy to monitor light emissions from the plasma as the etch process progresses. One such system is disclosed in U.S. Pat. No. 5,308,414 to O'Neill et al. Such a system monitors the optical emission intensity of the plasma in a narrow band as well as a wide band and generates signals indicative of the spectral intensity of the plasma. When the signals diverge, a termination signal is generated thereby terminating the etch process. Other techniques include the use of laser interferometry, beamsplitters and diffraction gratings to measure the phase shift of a laser beam reflected from two closely spaced surfaces. For example, the phase shift between a first beam reflected off the mask pattern and the beam reflected off an etched portion of the wafer is measured and compared to a predetermined phase shift that corresponds to the desired etch depth. Unfortunately such monitoring and measuring systems are plagued by inadequate signal to noise ratios. Additionally, the minimum etch depth is limited by the wavelength of the light source used in the monitor. Another technique for measuring etch depth is ellipsometry, which measures the change in polarization of light upon reflection of the light from a surface. Unfortunately, the error in etch depth detection in systems that use polarized laser beams too great to be useful.

In situ etch depth monitoring is of particular interest in systems where plasma excitation coils are used. Such a system is the Decoupled Plasma Source (DPS) system manufactured by Applied Materials, Inc. of Santa Clara, Calif. For example, RF power applied to a coil configuration atop a process chamber assists in creating the plasma that performs the etch process. However, the RF power may inductively couple into the neighboring monitoring equipment thereby corrupting the monitoring signals. As such, in situ monitoring of etch depth in a high power RF environment is inadequate and prone to severe inaccuracy.

Therefore, a need exists in the art for an apparatus for performing direct, in situ measurement of etch depth in a high power RF environment as well as monitoring other processes performed by a semiconductor wafer processing system.

SUMMARY OF THE INVENTION

The disadvantages associated with the prior art are overcome by the present invention of an apparatus for performing direct, in situ monitoring of a process in a semiconductor wafer processing system. Specifically, the present invention provides a process chamber having a dome circumscribed by an antenna, the dome having an opening, an enclosure disposed above the chamber, a process monitoring assembly disposed proximate said dome and a window covering the opening. Further, the process monitoring assembly consists of a signal source, a signal detector, a collimating assembly and a transmission cable having a first end and a second end whereby the first end is connected to the collimating assembly and the second end is connected to the signal source and the signal detector.

A portion of the apparatus supports the process monitoring assembly to establish a line-of-sight from the monitoring assembly, through the window to a substrate (i.e., a semiconductor wafer). The window can be permanently affixed to the opening or removable. The monitoring apparatus can be located totally within the enclosure or a portion of it can be outside of the enclosure.

A method of fabricating the inventive apparatus consists of the steps of boring an opening proximate an apex in the dome, positioning the process monitoring assembly in proximity to the dome so as to allow a line-of-sight from the process monitoring assembly to a wafer, and covering the opening with a window. The window is permanently affixed or removable dependent upon the type of process monitoring apparatus being used in the system.

With the method and apparatus as disclosed, process measurement and monitoring is conducted without encountering interference from high power energy sources proximate the chamber. Specifically, the monitoring assembly is positioned away from RF power sources that can arbitrarily couple power into the monitoring assembly. Additionally, the line-of-sight feature of the subject invention simplifies the overall design and allows retrofitting of chambers not previously using such in-situ monitoring devices. The apparatus further provides versatility since the removable window allows interchanging different types of monitoring apparatus. Specifically, plasma-based lamps, laser interferometers, X-ray emitters and the like are optimized by selecting different types of window material (i.e., sapphire, quartz and the like) through which monitoring beams propagate.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present invention is an apparatus for performing direct, in situ monitoring of processes such as etch depth of and thin film deposition upon a semiconductor wafer within a semiconductor wafer processing system. The invention provides for measurement of a variety of emissia or reflected light dependent upon chamber conditions and monitoring apparatus preferences and parameters. Specifically, the invention is used for monitoring the depth of various types of etch processes from within a dome temperature control enclosure of a Metal Etch Decoupled Plasma Source (DPS) chamber manufactured by Applied Materials of Santa Clara, Calif. A dome temperature control enclosure and apparatus of the Metal Etch DPS chamber is disclosed in U.S. patent application Ser. No. 08/767,071 filed Dec. 16, 1996 and is herein incorporated by reference. The processes that can be monitored include but are not limited to gate etch, recess etch, deep trench and shallow trench isolation for the production of DRAM memory and logic circuits.

Figure 1:
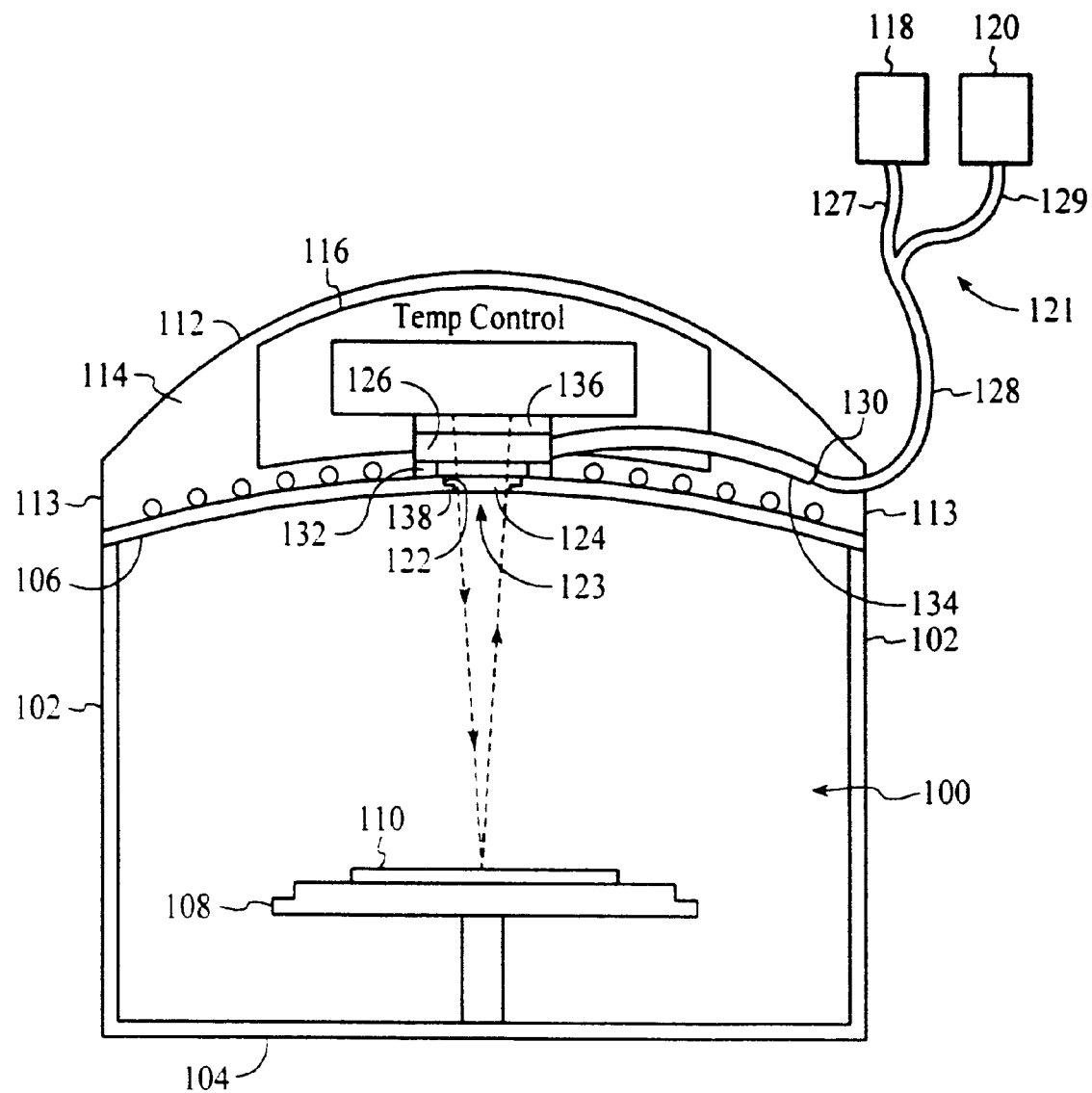
FIG. 1 depicts a schematic representation of a high power RF etch chamber containing the present invention.

FIG. 1 depicts a schematic representation of the inventive apparatus in its operating environment, e.g., measuring etch depth as a semiconductor wafer is etched. Specifically, a process chamber 100 is defined by walls defining a processing enclosure capable of sustaining an environment suitable to process a substrate. The walls should, for example, be capable of maintaining a vacuum or low pressure environment in the chamber. The walls are defined by, for example, sidewalls 102, a bottom 104 and a dome 106 or ceiling or top portion. The ceiling 106 includes at least a portion that substantially faces the substrate, shown in FIGS. 1-4. The chamber 100 houses a substrate support pedestal 108 upon which a substrate (i.e., a semiconductor wafer) 110 is retained. An etch process is performed on the wafer 110 to create a desired integrated circuit pattern or the like. During the etch process, temperature control of the dome 106 is critical to proper etching of the wafer. As such, an additional enclosure 114 is defined by sidewalls 113 and cover 112 above the dome 106. Within this enclosure 114 is a temperature control apparatus 116. A temperature control apparatus 116 maintains the temperature of the dome 106 within a preferred, optimum operating range.

Additionally, the enclosure 114 also houses a device for monitoring the processing, e.g., depth of the etch process that occurs at the wafer surface. Specifically, a collimating assembly 126 is disposed above the dome 106. A signal source 118 and signal sensor 120 are connected to the collimating assembly 126 via a transmission cable 128. While a fiber optic cable is a preferred device for connecting the signal source 118 and signal sensor 120 to the collimating assembly 126, any suitable transmission cable may be used. The combination of the collimating assembly 126, the signal source 118, signal sensor 120 and transmission cable 128 comprise a monitoring assembly 121. In a preferred embodiment of the invention, a second, bifurcated end of the fiber optic cable has two branches. A first branch 127 of the bifurcated end of the fiber optic cable is attached to the signal source 118 and a second branch 129 is attached to the signal detector 120. Both the signal source 118 and signal detector 120 are outside the enclosure 114. A first, single end of a fiber optic cable extends through an opening 130 in the sidewall 113 of the enclosure 114 and is attached to the collimating assembly 126. The transmission cable 128 and collimating assembly 126 may be provided with shielding elements 134 and 136 respectively to avoid RF power (explained in greater detail below) and excessive temperature from coupling into or effecting these devices. Alternately, the devices are manufactured from non-conductive materials such as high temperature plastics, ceramics and the like or are a combination of shielded and non-conductive components.

The top of the dome defines an apex 123. An opening 122 is bored into the dome 106 proximate the apex 123. To maintain the integrity of the chamber conditions during wafer processing, a window 124 is placed in the opening 122. Preferably, the window 124 is a slab of transparent material having a low refractive index so as to prevent excessive refraction of an optical beam. Materials such as quartz and sapphire can be used to create the window. Fused silica is also a viable window material because it has a higher transmissibility of ultraviolet light than ordinary glass. Ideally, the window 124 and dome 106 are machined to high tolerances so as to create a flush mounting surface. Specifically, the opening 122 in the dome 106 has a flange thereby providing a supporting lip 138 upon which the window rests.

The window may be permanently adhered to the dome or removable therefrom. If the window is permanently adhered to the dome, an adhesive is used along the supporting lip 138 of the dome 106 to affix the window 124 and maintain chamber conditions. Alternately, the window 124 is fused or welded to the opening 122. If the window is removable, both the window and the opening are specially prepared. Specifically, the supporting lip 138 and the window 124 are polished.

The two polished surfaces are sealed with an O-ring (not shown) placed between the supporting lip 138 and the window 124. As such, an air-tight seal is formed when a vacuum produced in the chamber 100 draws the window 124 down onto the supporting lip 138. In a preferred embodiment of the invention, the window 124 is permanently affixed to the dome 106. A permanent window is affixed to the opening during manufacture of the dome and is constructed of a material that is specific to the type of monitoring apparatus used in the enclosure. For example, a laser interferometer is used in combination with a window comprised of sapphire.

With the invention as described above, a wide angle, line-of-sight measurement can be taken as the wafer is being processed. In a preferred embodiment of the invention, the signal source 118 is an optical source capable of emitting an optical beam of sufficient wavelength, frequency and amplitude to propagate through the chamber processing environment without excessive levels of signal degradation or interference. Preferably, a low pressure, mercury-based plasma lamp operating in the 185-700 nm range is used as the signal source. Alternately, cadmium, zinc or other plasma-based or laser-based lamps may be used for the signal source in place of the mercury-based plasma lamp. An optical beam from the signal source 118 travels through the first branch 127 of the bifurcated end of the fiber optic cable 128 to the collimating assembly 126, through the window 124 and onto the wafer 110. A relatively large (i.e., approximately 1 square inch diameter) area of the wafer encompassing at least one entire die pattern being etched is illuminated by the optical beam. As such, a larger area is available for etch depth monitoring which provides greater accuracy in determining the overall etch rate of the wafer.

The signal sensor 120 is an optical sensor capable of receiving reflected beams of radiation, for example light radiation, from the wafer 110 that have propagated through the chamber processing environment. Preferably, the signal sensor is a narrow band (approximately 2 nm) monochromator with a silicon photodiode or photomultiplier. In an alternate embodiment, the signal sensor is a photomultiplier with a narrow band (approximately 2 nm) optical filter placed in front of the photomultiplier. The optical filter's multiple layers of dielectric film function as a band pass filter. That is, desired wavelengths of reflected beams from the wafer pass through the optical filter while all other wavelengths are screened out. For example, light from the plasma within the chamber does not enter the photomultiplier. This type of filtering greatly enhances the signal-to-noise ratio of the reflected beams. Specifically, a reflected beam from the wafer 110 propagates through the process chamber 100, window 124, collimating assembly 126, into the fiber optic cable 128 and exiting at the second branch 129 of the bifurcated end of the fiber optic cable 128 and into the signal sensor 120. The signal sensor 120 processes the reflected signal into an etch rate signal that may be passed on to a computer (not shown) for additional processing, display device (not shown) to depict progress of wafer processing or the like. Alternately, the signal detector 120 may be a CCD camera to form part of an image relay system.

Figure 6:
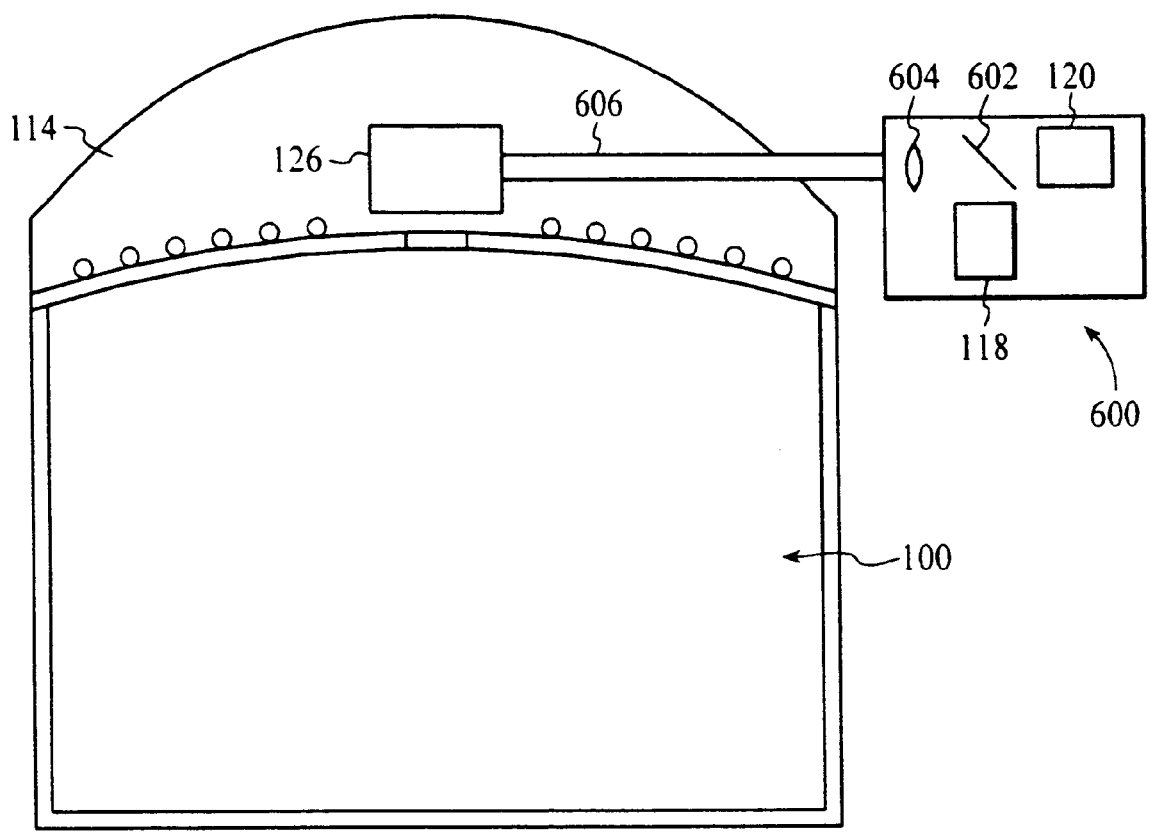

The above described monitoring assembly 121 need not be designed from separate components interconnected by a transmission cable. FIG. 6 depicts a simplified schematic representation of an alternate embodiment of the present invention whereby the signal source 118 and signal detector 120 comprise a single monitoring unit 600. Specifically, the signal source 118 and signal detector 120 are oriented at an angle of 90° from one another with a beamsplitter 602 and additional lens assembly 604 acting as a signal relay interface. The monitoring unit 600 may then be connected to the collimating assembly 126 via a non-bifurcated fiber optic cable 606 or other similar transmission cable. This type of configuration is especially useful when using short wavelength light as the signal source.

Figure 2:
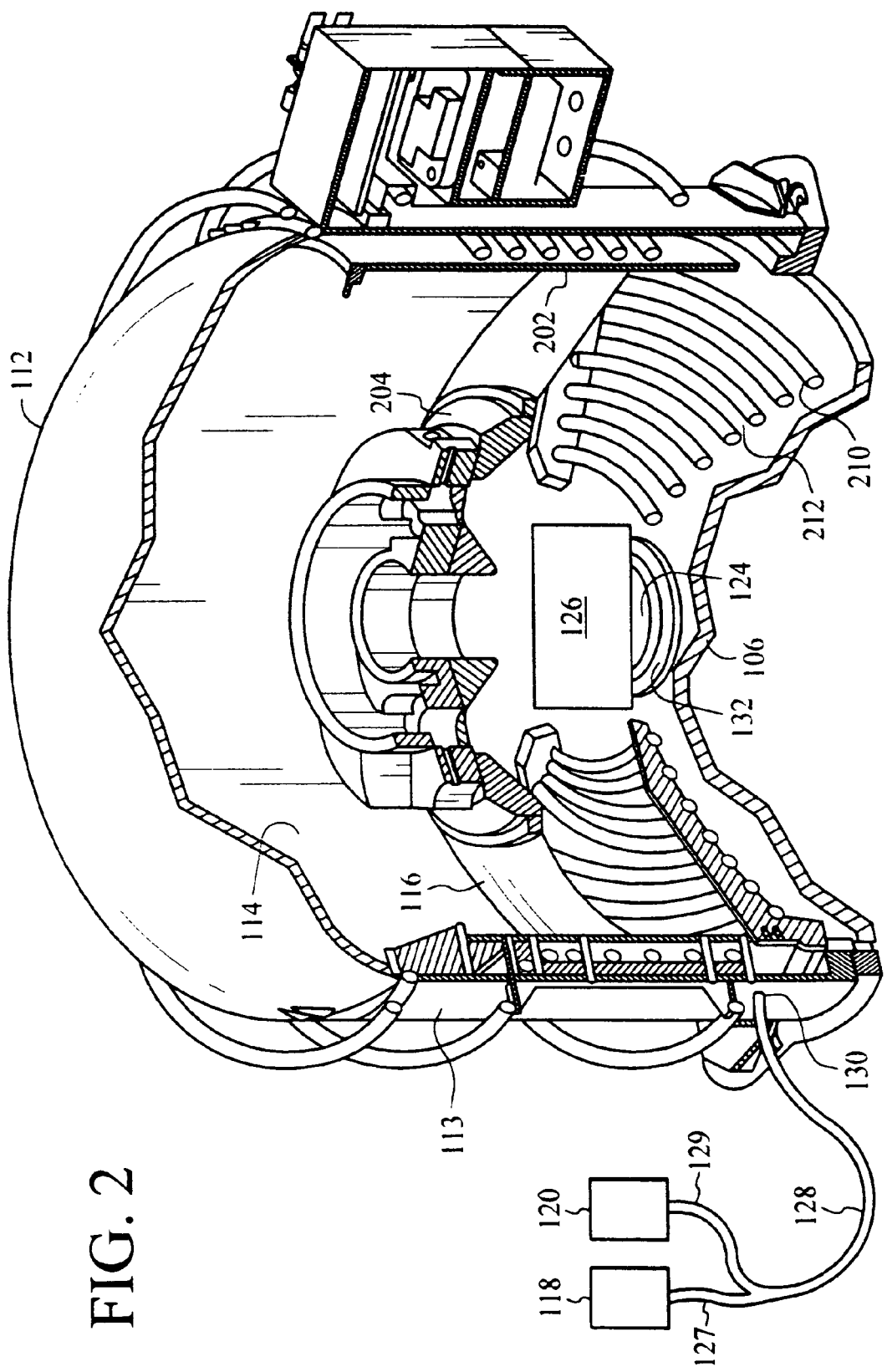
FIG. 2 depicts a partially sectional, perspective view of the upper portion the etch chamber containing the present invention.

FIG. 2 depicts a detailed partial sectional, perspective view of the enclosure 114. Specifically, the enclosure 114 is bounded by a cylindrical sidewall 113 extending vertically from a circumferential edge of the dome 106 to the cover 112. A portion of the temperature control apparatus 116 extends from an inner wall 202 of the enclosure 114 towards the center terminating at an annular lip 204. Other portions of the temperature control device have been omitted from the figure for clarity. A support bracket 132 is secured to the dome 106 and circumscribes the opening 122. The collimating assembly is attached to the support bracket 132 to support the collimating assembly 126 above the window 124. Preferably the support bracket is fabricated from a high temperature plastic such as Ultem® (a registered trademark of General Electric).

Aside from forming the lower extremity of the enclosure 114, the dome 106 also defines a surface 212 that is external to the chamber processing environment that supports an RF antenna 210. Specifically, a single length of a conductor (i.e., a copper coil) is positioned at the circumference of the dome 106 and coiled radially inward forming multiple turns. The coil can have separate turns with each turn having a different radius or can spiral radially inward with a continuously changing radius for its different turns. The antenna coil covers approximately ⅔ of the support surface 212. As can be seen in FIGS. 1-4, the antenna 210 covers at least a portion of the external surface 212 of the dome or ceiling 106 that substantially faces the substrate 110. The antenna 210 is coupled to a high power RF power source (not shown) for the purpose of ionizing a process gas into a plasma in the process chamber 100. The antenna 210 and the RF source form a decoupled plasma source. Preferably, the dome 106 is opaque quartz or a ceramic such as alumina. Such materials are substantially transparent to infrared wavelengths that are produced by lamps within the temperature control unit. The heat produced by these emissions are used to heat the chamber environment. As such, the dome 106 is permeable to the magnetic fields from the antenna 210 which control and enhance plasma characteristics. Proximate the apex 123 of the dome 104, the opening 122 is formed. As such, the beams from and to the collimating assembly 126 pass through the opening 122 and into and out of the process chamber 100.

As discussed earlier, one embodiment of the invention has a permanently affixed window. In an alternate embodiment of the invention, the window is removable from the dome. A removable window adds flexibility to the apparatus in that different types of signal sources and sensors can be used in the same chamber. For example, a chamber using a low pressure, mercury-based plasma lamp and a sapphire window can be retooled to accept a laser interferometer and a quartz window. The material chosen for the window is based upon the wavelength of the beams used in the monitoring assembly. Although mercury lamps, laser interferometers and X-rays are discussed, any type of optical beam equipment can be used. Similarly, any type of material besides sapphire and quartz can be used for the window to optimize transmission of the beams, refraction index and general operation of the device. For example, quartz is more etch resistant than sapphire, but sapphire has a lower cost and different transmission bandwidth than sapphire. Although methods of permanently and removably affixing the window to the dome are discussed any means for affixing the window to the dome can be used to optimize the ability to retool the chamber or obtain adequate measurements from the monitoring assembly.

Figure 3:
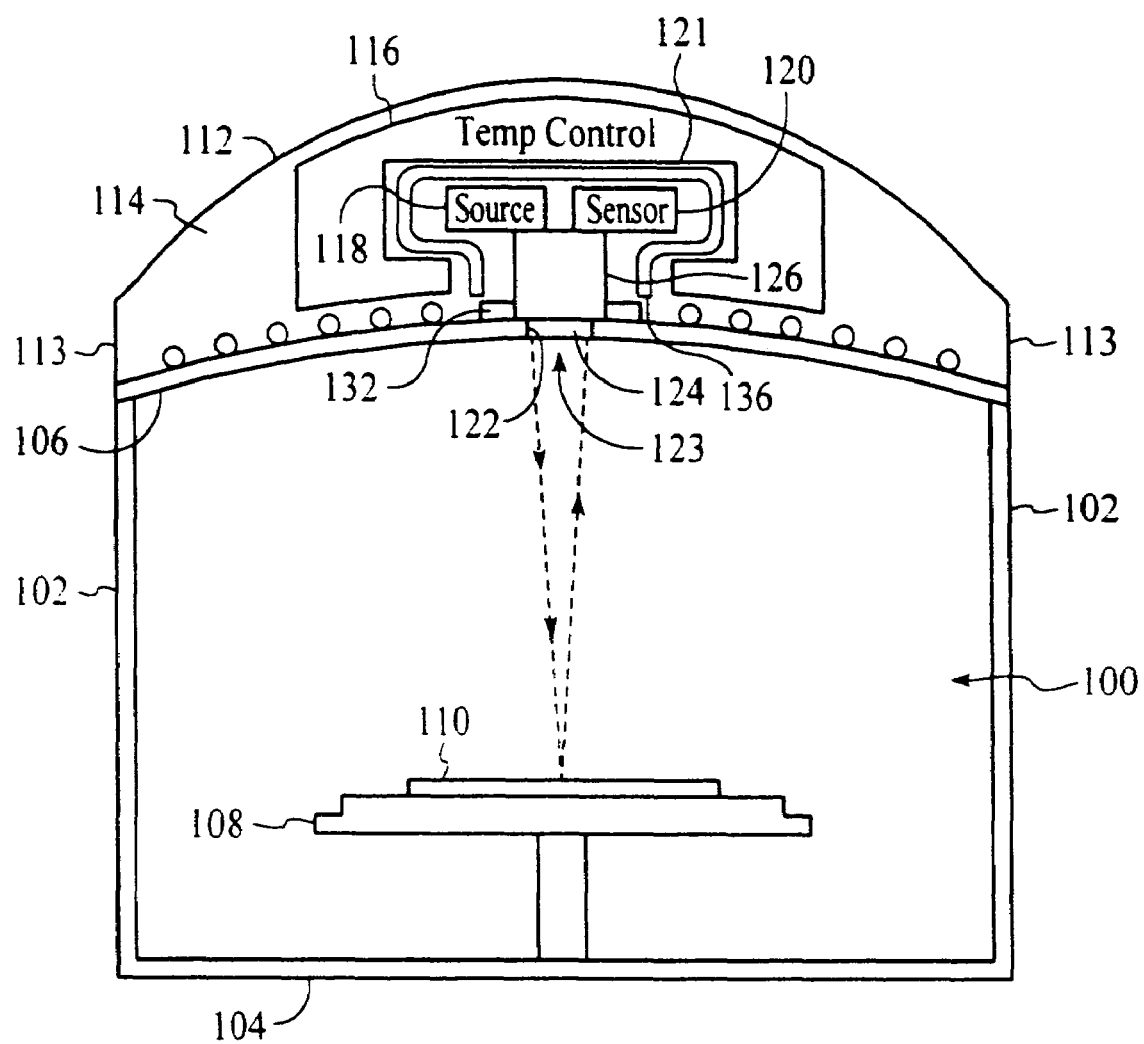
FIG. 3 depicts a schematic representation of a high power RF etch chamber containing a second embodiment of the present invention.
Figure 4:
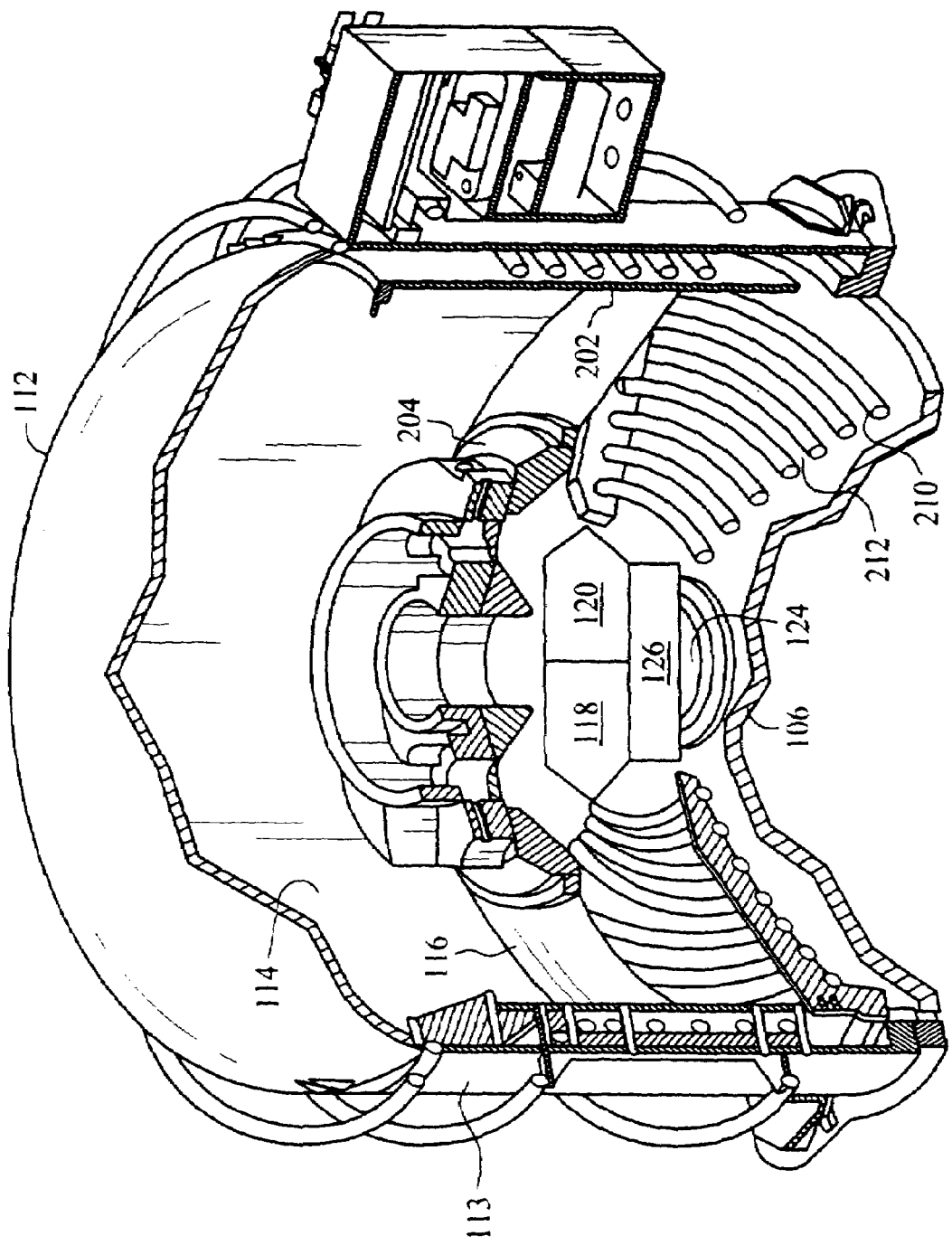
FIG. 4 depicts a partially sectional, perspective view of the upper portion of the etch chamber containing the second embodiment of the present invention.

FIGS. 3 and 4 depict a further embodiment of the inventive apparatus. Specifically, FIG. 3 depicts a schematic representation of the etch chamber 100 with enclosure 114 and temperature control apparatus 116 similar to that depicted in FIG. 1. However, in this embodiment, the signal source 118 and signal detector 120 are mounted inside the enclosure 114. The signal source 118 and signal detector 120 are provided with shielding 136 from RF sources and excessive temperatures and are disposed directly above the collimating assembly 126. Specifically, the signal source 118 and signal detector 120 are mounted to the collimating assembly 126. As indicated previously, the collimating assembly 126 can also be shielded and held secure to temperature control apparatus 116 via support bracket 132. This all-internal configuration is also shown in a partially sectional perspective view in FIG. 4. As can be seen from either figure, this configuration provides an elegant and highly simplified solution to in-situ measurement. Specifically, no external components are used in this embodiment thus eliminating the need for a fiber optic (or similar signal transmission) cable and for the additional hole (130 of FIGS. 1 and 2) in the enclosure.

Figure 5:
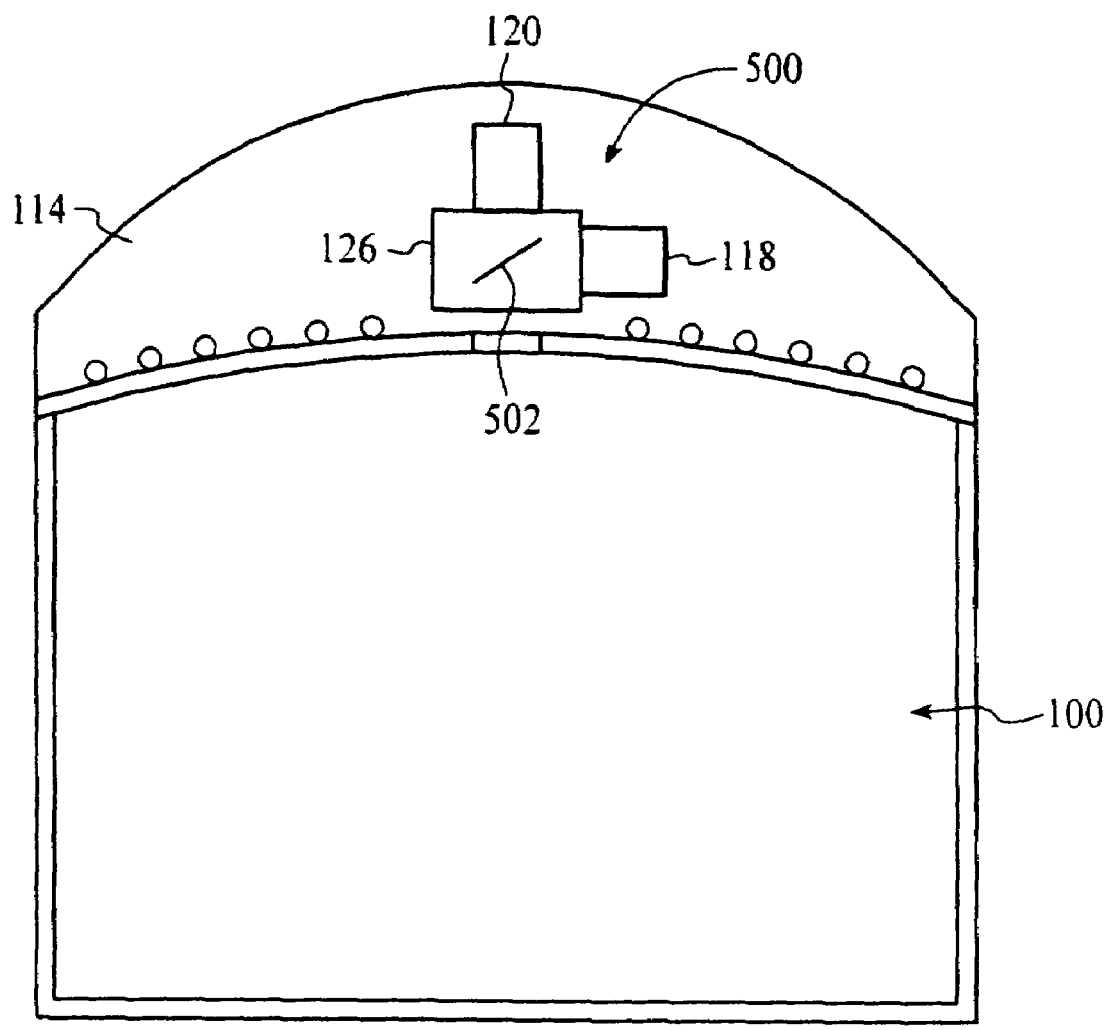
FIG. 5 depicts a schematic representation of a high power RF etch chamber containing a third embodiment of the present invention and FIG. 6 depicts a schematic representation of a high power RF etch chamber containing a fourth embodiment of the present invention.

The signal source 118 and signal detector 120 need not be disposed in a side-by-side arrangement. For example, FIG. 5 depicts an alternate embodiment of the monitoring assembly 500 whereby the signal source 118 and signal detector 120 are oriented at an angle of 90° from each other with a modified collimating assembly functioning as a relay interface between the signal source 118 and signal detector 120. The modified collimating assembly contains additional optical devices (i.e., folding mirrors and/or lens 502) to properly direct the signal source and reflected beams. From this discussion one skilled in the art can design such an internal monitoring assembly in a variety of configurations. In the spirit and scope of this specification the monitoring assembly is in no way limited to the described configurations. The signal source, signal detector, collimating assembly and attendant hardware can be arranged in any configuration necessary to create a monitoring assembly that is totally internal to the enclosure or similar chamber top surface.

With the configuration as described, an optical measurement apparatus is created that is capable of in-situ monitoring of the etching process. Specifically, an optical beam of radiation, for example light radiation, from the source 118 propagates through the window 124 and chamber 100 to the wafer surface. An incident beam reflects from the wafer surface, propagates back through the window 124, collimating assembly 126, transmission cable 128 and is detected by the sensor 120. Since the monitoring assembly 121 is shielded and/or positioned away from the antenna coils, interference or RF power coupling is minimized. All or part of the monitoring assembly may also be in close proximity to heat lamps which are part of the temperature control apparatus. Reducing thermal expansion of monitoring components is important so as to reduce the likelihood of misalignment of the apparatus. Such misalignment can lead to erroneous signal detection. The shielding element 130 can be fashioned as sleeve surrounding the transmission cable 128 fabricated from polyetheretherketone. The shielding element 136 can be a metallic plate with a painted or otherwise applied dielectric coating. Additionally, the improved apparatus requires no major retooling of existing chamber components. The design increases flexibility by allowing use of different types of process monitoring equipment in the same chamber.

The above described apparatus is not limited to use inside an enclosure above a wafer process chamber. Nor does the window or opening in which the window is fitted need to be part of or affixed to a dome shaped top surface. The top surface may be partially dome-shaped, flat, concave or any configuration suitable for sealing the process chamber. The window 124 and opening 122 need not be at the apex of the dome or similar top surface as they can be off center. Additionally, there need not be only one window and corresponding opening. There may be a plurality of openings in the top surface each covered by a separate window or all covered by a single plate disposed above the top surface. In such a configuration having a plurality of openings and windows, there can be a single source providing illumination at all openings or a plurality of sources providing illumination to a group of openings or to each opening individually. Accordingly, there can be a single detector receiving reflected beams passing through all of the openings. Alternately, there can be a plurality of detectors receiving reflected signals from a group of openings or from each opening individually.

Although various embodiments which incorporate the teachings of the present invention have been shown and described in detail herein, those skilled in the art can readily devise many other varied embodiments that still incorporate these teachings.

What is claimed is:

1. A method of etching a substrate in a process chamber comprising a wall, the method comprising:
   providing a substrate in the process chamber, the substrate having a surface;
   introducing an etching gas into the process chamber;
   applying an RF current through a multi-turn antenna covering a top surface of the chamber wall to pass RF energy through the chamber wall to the etching gas inside the process chamber to energize the etching gas to etch trenches in the substrate;
   detecting radiation reflected from the substrate from directly above the surface of the substrate after the radiation propagates through the chamber wall; and
   evaluating the detected radiation to monitor the depth of a layer being etched on the substrate.

2. A method according to claim 1 wherein the radiation propagating through the chamber wall comprises an optical beam.

3. A method according to claim 1 wherein the chamber wall comprises a window that (1) faces the substrate, (2) is permeable to X-rays, (3) is permeable to an optical beam, (4) comprises one or more of silica, sapphire or quartz, (5) is removable from the chamber wall, or (6) is permanently affixed about an opening in the chamber wall.

4. A method according to claim 1 comprising monitoring radiation propagating through the chamber wall with a process monitoring assembly, and wherein the process monitoring assembly (1) is housed in an enclosure above the chamber wall, (2) is adapted to be mounted above a window in the chamber wall, (3) is mounted to allow line-of-sight view of the substrate in the process chamber, (4) is responsive to radiation, or (5) comprises an interferometer.

5. A method according to claim 1 comprising applying an RF current through a multi-turn antenna above a top surface of a portion of a chamber wall comprising a ceiling of the process chamber facing the substrate to inductively couple the RF energy through the portion of the ceiling of the process chamber to the gas inside the process chamber to energize the gas.

6. A method according to claim 1 comprising collimating the detected radiation and evaluating the detected collimated radiation to monitor the depth of a layer being processed on the substrate.

7. A method according to claim 1 comprising powering an antenna covering a portion of the chamber wall to couple the RF energy to gas in the chamber.

8. A method according to claim 1 wherein the chamber wall is at least partially covered by a multi-turn antenna, and the chamber comprises a cathode within the chamber, and wherein the method comprises coupling RF energy to the gas in the chamber by applying RF currents to the cathode and multi-turn antenna.

9. A method according to claim 1 wherein the chamber wall is a flat wall and a multi-turn antenna at least partially covers the flat wall, and wherein the method comprises coupling energy across the flat wall to the gas in the chamber by powering the multi-turn antenna.

10. A method according to claim 1 wherein the chamber wall comprises a ceiling, and wherein the method comprises monitoring radiation from above the ceiling.

11. A method according to claim 1 comprising coupling RF power to the gas by powering a non-vertical multi-turn antenna comprising a coil that spirals radially inward.

12. A method according to claim 1 comprising coupling RF power to the gas by powering a non-vertical multi-turn antenna comprising a coil having separate turns, each turn having a different radius.

13. A method according to claim 1 comprising monitoring radiation propagating through the chamber wall with a process monitoring assembly comprising a signal source, a signal detector, a collimating assembly and a radiation transmission cable connecting the collimating assembly to the signal source and signal detector, the radiation transmission cable having a bifurcated end.

14. A method according to claim 13 comprising connecting a first branch of the bifurcated end to the signal source and a second branch of the bifurcated end to the signal detector.

15. A method according to claim 5 comprising directing radiation onto the substrate surface from directly above the surface of the substrate and through the top surface of the portion of the ceiling of the process chamber.

16. A method according to claim 15 comprising detecting radiation reflected from the substrate from directly above the surface of the substrate after the radiation propagates through a window in the portion of the ceiling facing the substrate.

17. A method according to claim 1 wherein the chamber wall comprises a top surface that is above the substrate, and wherein the method comprises coupling RF energy across a substantial portion of the top surface to the gas in the chamber.

18. A method according to claim 17 wherein the process chamber comprises a multi-turn antenna above the top surface, and wherein the method comprises coupling RF energy thorough the top surface by powering the multi-turn antenna.

19. A method according to claim 1 comprising detecting radiation propagating through a chamber wall comprising a ceramic.

20. A method according to claim 19 wherein the ceramic comprises alumina or silica.

21. A method according to claim 1 comprising energizing the gas by powering a multi-turn antenna comprising a spiral coil.

22. A method according to claim 21 wherein the multi-turn antenna covers a portion of a chamber wall comprising a ceiling of the process chamber and is non-vertical.

23. A method according to claim 22 wherein the ceiling comprises a ceramic that is permeable to RF energy.

24. A method of etching a substrate in a process chamber, the process chamber comprising a wall and having a non-vertical multi-turn antenna above the wall, the method comprising:
    placing in the process chamber, a substrate having a layer;
    introducing an etching gas into the process chamber;
    powering the non-vertical multi-turn antenna covering a top surface of the chamber wall to couple energy through the wall to the etching gas inside the process chamber to energize the etching gas to etch the layer on the substrate;
    detecting radiation reflected from the substrate from directly above the surface of the substrate after the radiation propagates through the wall; and
    evaluating the detected radiation to monitor the depth of the layer being etched on the substrate.

25. A method of etching a substrate in a process chamber, the process chamber comprising a ceiling and a multi-turn antenna above the ceiling, the method comprising:
    providing a substrate in the process chamber, the substrate having a surface;
    introducing an etching gas into the process chamber;
    applying an RF current to the multi-turn antenna to pass RF energy through the ceiling of the process chamber to the etching gas inside the process chamber to energize the etching gas;
    detecting radiation reflected from the substrate from directly above the surface of the substrate after the radiation propagates through the ceiling; and
    evaluating the detected radiation to monitor etching of the substrate.

* * * * *